United States Patent
Chen et al.

(10) Patent No.: US 11,540,431 B2
(45) Date of Patent: Dec. 27, 2022

(54) VOLTAGE CONVERSION DEVICE

(71) Applicant: DELTA ELECTRONICS, INC., Taoyuan (TW)

(72) Inventors: Heng-Chao Chen, Taoyuan (TW); Chia-Min Ho, Taoyuan (TW); Li-Yen Chang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 17/500,865

(22) Filed: Oct. 13, 2021

(65) Prior Publication Data

US 2022/0304203 A1    Sep. 22, 2022

(30) Foreign Application Priority Data

Mar. 18, 2021    (CN) .......................... 202110291693.4

(51) Int. Cl.
*H05K 9/00*    (2006.01)
*H05K 7/14*    (2006.01)

(52) U.S. Cl.
CPC ......... *H05K 9/0024* (2013.01); *H05K 7/1427* (2013.01)

(58) Field of Classification Search
CPC .. H05K 9/0032; H05K 9/0033; H05K 9/0029; H05K 9/0031; H05K 9/0035
See application file for complete search history.

(56) References Cited

U.S. PATENT DOCUMENTS

| | | | | |
|---|---|---|---|---|
| 4,736,266 A | * | 4/1988 | Tanibe ................. | H05K 9/0039 439/85 |
| 5,160,807 A | * | 11/1992 | Fry ..................... | H05K 9/0033 174/DIG. 35 |
| 2009/0016039 A1 | * | 1/2009 | Imamura .............. | H05K 3/3405 361/818 |
| 2012/0241431 A1 | * | 9/2012 | Sickels ................. | B23K 9/133 219/137.7 |
| 2013/0148318 A1 | * | 6/2013 | Kim ..................... | H05K 9/0009 361/759 |
| 2014/0049935 A1 | * | 2/2014 | Chen .................... | H05K 9/0033 361/818 |
| 2015/0131354 A1 | * | 5/2015 | Nakajima ............ | H05K 7/1432 363/144 |
| 2015/0264844 A1 | * | 9/2015 | Jang .................... | H05K 9/0035 361/784 |

\* cited by examiner

*Primary Examiner* — James Wu
*Assistant Examiner* — Christopher L Augustin
(74) *Attorney, Agent, or Firm* — Chun-Ming Shih; HDLS IPR Services

(57) ABSTRACT

A voltage conversion device having a circuit board and a metal shielding cover are provided in this disclosure. The circuit board has a front surface and a back surface. The front surface of the circuit board is provided with a transformer circuit and an assembling terminal electrically connected to the transformer circuit. A through hole is defined at a position on the circuit board corresponding to the assembly terminal. The back surface of the circuit board is covered by the metal shielding cover, and the metal shielding cover is provided with a conductive pin corresponding to the assembling terminal. The assembling terminal is provided with a clamp, and the clamp is arranged corresponding to the position of the through hole. The conductive pin passes through the through hole and clamped by the clamp, and the metal shielding cover is thereby fixed on the circuit board.

11 Claims, 11 Drawing Sheets

VOLTAGE CONVERSION DEVICE

BACKGROUND

Technical Field

This disclosure is related to a voltage conversion device and in particular to a voltage conversion device suitable for an automatic assembling process.

Description of Related Art

A related-art voltage conversion generally has a transformer circuit board, electronic elements are disposed on one surface of the transformer circuit board, and another surface of the transformer circuit therefore should be covered by a metal cover in order to shield electromagnetic interferences. However, soldering points of the electronic elements are shielded by the metal cover. In order to automatically solder the electronic elements, the metal cover is not automatically soldered in a solder machine at the time when the electronic elements are soldered to the circuit board. Instead, the metal cover should be fixed onto the circuit board via an additional process of manual soldering.

In manufacturing processes and assembling processes, the manual soldering cannot be controlled under a uniform quality standard, because soldering performances of respective operators are different, and the product yield rate is therefore unstable. Moreover, cost of manual soldering is much higher than that of the automatic assembling process.

In views of this, in order to solve the above disadvantage, the inventor studied related technology and provided a reasonable and effective solution in this disclosure.

SUMMARY OF THE DISCLOSURE

A voltage conversion device suitable for an automatic assembling process is provided in this disclosure.

A voltage conversion device having a circuit board and a metal shielding cover is provided in this disclosure. The circuit board has a front surface and a back surface. A transformer circuit and at least one assembling terminal electrically connected to the transformer circuit are disposed on the front surface of the circuit board. A through hole is disposed on the circuit board at a position corresponding to the assembling terminal. The metal shielding cover covers the back surface of the circuit board, and at least one conductive pin corresponding to the assembling terminal is arranged on the metal shielding cover. The assembling terminal has a clamp, the clamp is arranged corresponding to the position of the through hole, the conductive pin passes through the through hole and is clamped by the clamp to fix the metal shielding cover on the circuit board.

The voltage conversion device of this disclosure further has an insulative housing, the circuit board and the metal shielding cover are accommodated in the insulative housing, and a profile of the metal shielding cover is matched with at least a portion of an internal surface of the insulative housing.

According to the voltage conversion device of this disclosure, the assembling terminal has a base upright arranged on the circuit board, a leg is extended from a bottom of the base and the leg is soldered to the circuit board, a pair of claws are extended from a side of the base, and the conductive pin corresponding to the assembling terminal is clamped between the claws.

According to the voltage conversion device of this disclosure, the assembling terminal has a base, the base is a cylinder upright arranged on the circuit board and surrounding the through hole, a leg is extended from a bottom of the base and the leg is soldered to the circuit board, a pair of claws faced to each other are extended from an internal surface of the base, and the conductive pin corresponding to the assembling terminal is inserted in the base and clamped between the claws.

According to the voltage conversion device of this disclosure, the assembling terminal has a base upright arranged on the circuit board, a leg is extended from a bottom of the base and the leg is soldered to the circuit board, a claw is extended from a side of the base, an end of the claw is reversed toward the base, and the conductive pin corresponding to the assembling terminal is clamped between the claw and the base.

According to the voltage conversion device of this disclosure, the assembling terminal has a base upright arranged on the circuit board, a leg is extended from a bottom of the base and the leg is soldered to the circuit board, a claw is extended from a side of the base, and a guiding slope is formed on the claw. The guiding slope faces the through hole and is obliquely arranged corresponding to the circuit board.

According to the voltage conversion device of this disclosure, the metal shielding cover is made of an aluminum or a stainless steel. The conductive pin is riveted on the metal shielding cover.

According to the voltage conversion device of this disclosure, the transformer circuit has a ground area, and the assembling terminal is electrically connected to the ground area.

According to the voltage conversion device of this disclosure, the metal shielding cover is provided with another conductive pin, each of the conductive pins are in a flat shape, and normal directions of each of the conductive pins are non-parallel with each other.

According to the voltage conversion device of this disclosure, the metal shielding cover is provided with another conductive pin and the circuit board is correspondingly provided with another assembling terminal on the front surface, a force direction of the assembling terminals exerted on the conductive pin is non-parallel with a force direction of the another assembling terminal exerted on the another conductive pin.

According to the voltage conversion device of this disclosure, the metal shielding cover is assembled in a buckling manner and therefore suitable for automatic assembling process. Moreover, other electronic elements are also suitable for automatic assembling process, and this disclosure is therefore suitable for fully automatic assembling process, and thereby manufacturing cost may be decreased.

DETAILED DESCRIPTION

Figure 1:
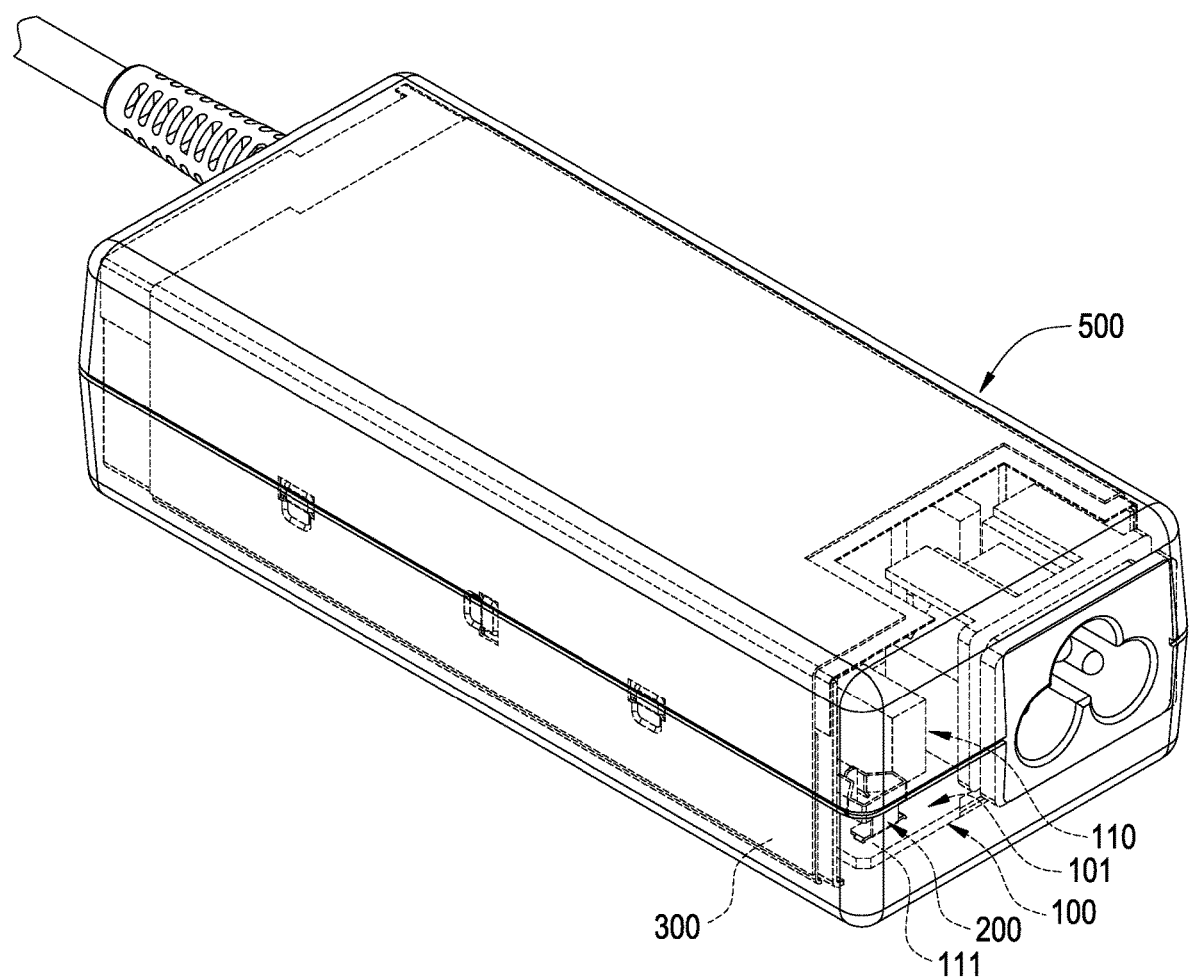
FIG. 1 is a perspective view showing a voltage conversion device according to one embodiment of this disclosure.
Figure 2:
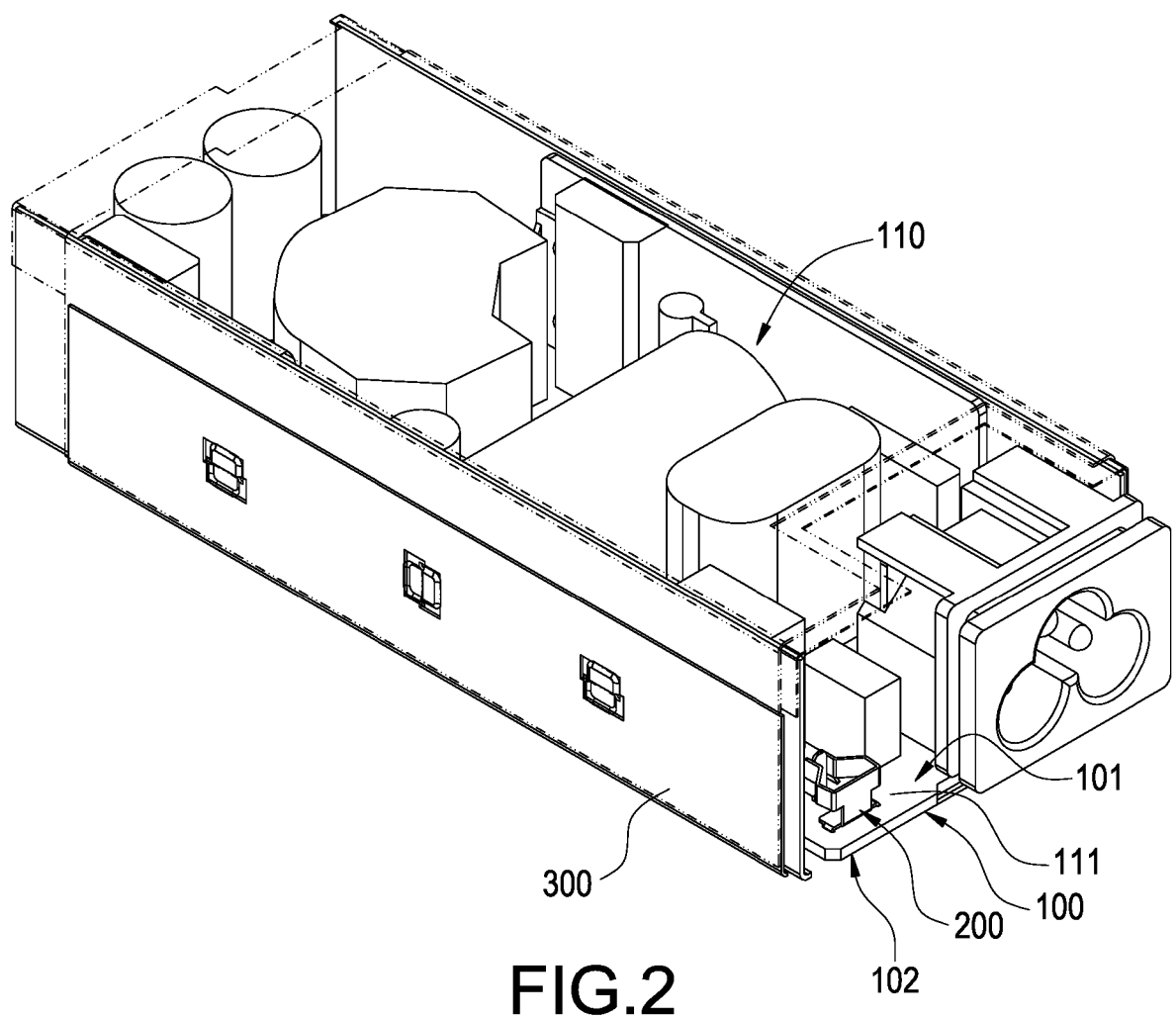
FIGS. 2 to 5 are exploded views showing the voltage conversion device according to the aforementioned embodiment of this disclosure.
Figure 3:
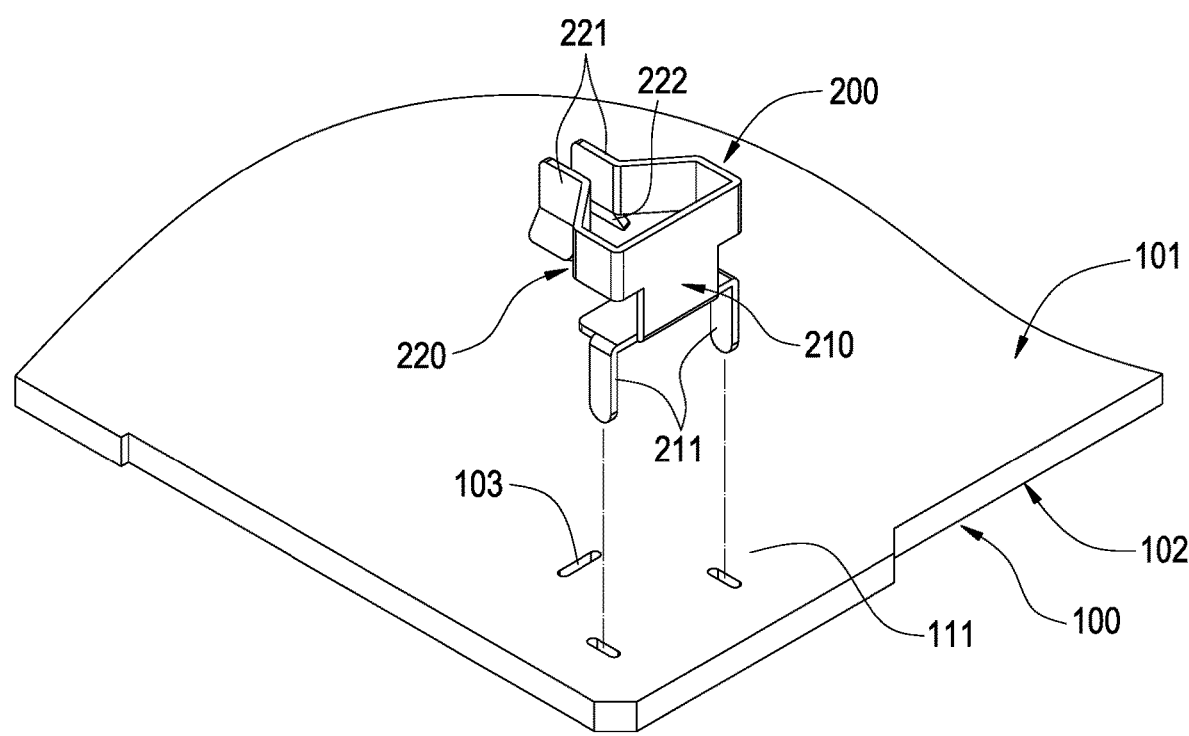
Figure 4:
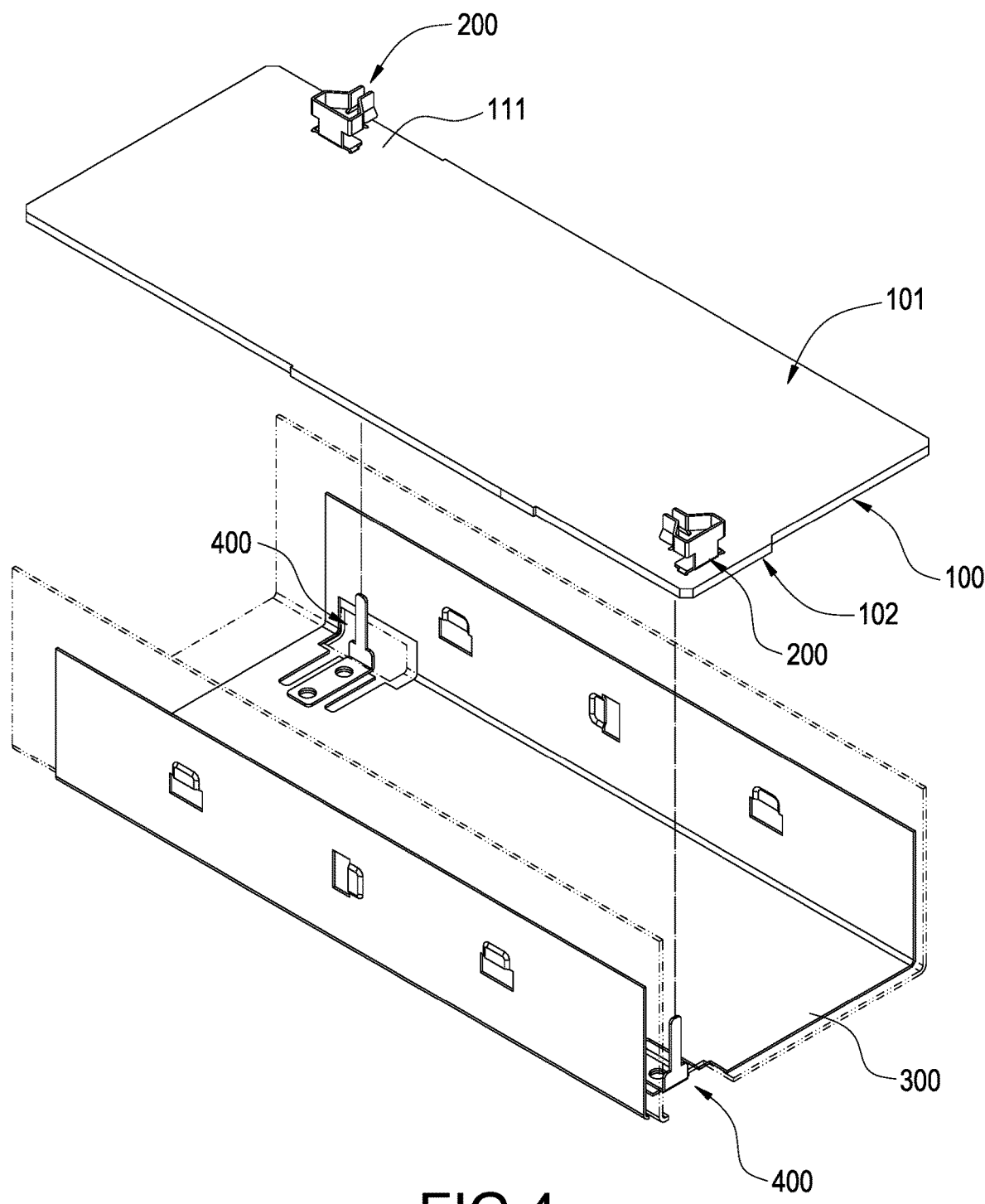
Figure 5:
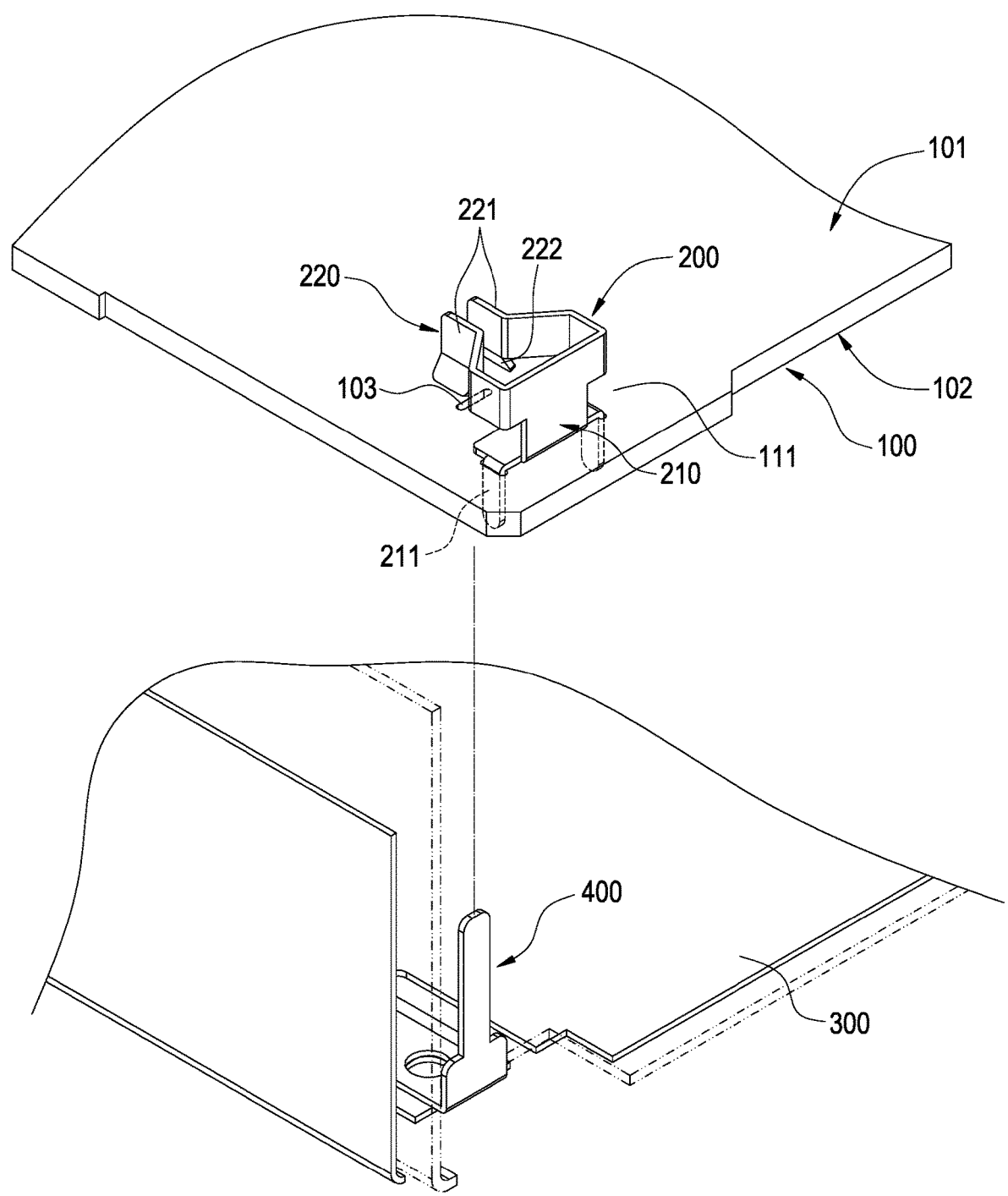
Figure 6:
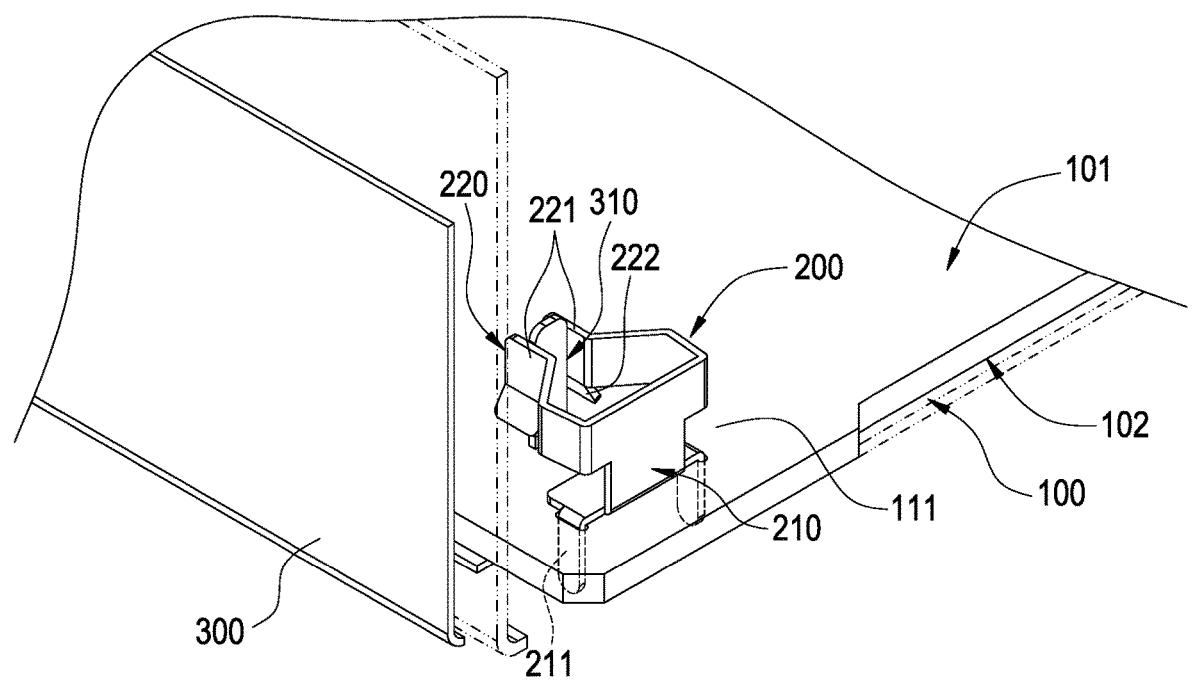
FIG. 6 is a lateral cross-sectional view of the voltage conversion device according to the aforementioned embodiment of this disclosure.

The technical contents of this disclosure will become apparent with the detailed description of embodiments accompanied with the illustration of related drawings as follows. It is intended that the embodiments and drawings disclosed herein are to be considered illustrative rather than restrictive.

According to one embodiment of this disclosure shown in FIGS. 1 to 6, a voltage conversion device (such as an adapter) having a circuit board 100 and a metal shielding cover 300 is provided.

The circuit board 100 has two surfaces which are respectively a front surface 101 and a back surface 102. A transformer circuit 110 and at least one assembling terminal 200 electrically connected to the transformer circuit 110 are disposed on the front surface 101 of the circuit board 100. A through hole 103 is defined on the circuit board 100 at a position corresponding to the assembling terminal 200. According to the voltage conversion device of this disclosure, the transformer circuit 110 has a ground area 111 and the assembling terminal 200 is electrically connected to the ground area 111.

The metal shielding cover 300 covers the back surface 102 of the circuit board 100, and the metal shielding cover 300 is provides with at least one conductive pin 400 corresponding to the assembling terminal 200. According to this embodiment, the metal shielding cover 300 is made of an aluminum or a stainless steel for shielding electromagnetic interference. The conductive pin 400 and the metal shielding cover 300 may be formed in one piece by punching, and thereby the manufacturing process may be simplified. Alternatively, the conductive pin 400 may be riveted to the metal shielding cover 300 to reinforce the connection structure. Furthermore, the conductive pin 400 may be made of a copper for the convenience of soldering, and it may be inserted into the assembling terminal 200 to be fixed and further soldered at the through hole 103. Therefore, instability of manual soldering may be avoided.

The assembling terminal 200 has a clamp 220, the clamp 220 is arranged corresponding to the position of the through hole 103, the conductive pin 400 passes through the through hole 103 and is clamped by the clamp 220 to fix the metal shielding cover 300 on the circuit board 100. Meanwhile, the metal shielding cover 300 is electrically connected to the ground area 111.

The voltage conversion device of this disclosure further has an insulative housing 500, the circuit board 100 and the metal shielding cover 300 are accommodated in the insulative housing 500, and a profile of the metal shielding cover 300 is matched with that of at least a portion of an internal surface of the insulative housing 500. The metal shielding cover 300 may shield electromagnetic interference and position the circuit board 100 at the same time.

According to the voltage conversion device of this disclosure, the assembling terminal 200 has a base 210 upright arranged on the circuit board 100, and a clamp 220. A leg 211 is extended from a bottom of the base 210 and the leg 211 is soldered with the circuit board 100. The clamp 220 has a pair of claws 221 extended from a side of the base 210, and the conductive pin 400 corresponding to the assembling terminal 200 is clamped between the claws 221. Moreover, each of the claws 221 is provided with a guiding slope 222.

The guiding slope 222 faces the through hole 103 and obliquely arranged relative to the circuit board 100. When the conductive pin 400 is inserted in the clamp 220, the conductive pin 400 may be guided by the guiding slope 222 and therefore easy to be inserted into the clamp 220.

Regarding to some arrangements, the metal shielding cover 300 is provided with single conductive pin 400, the circuit board 100 is correspondingly provided with single assembling terminal 200, and the metal shielding cover 300 of this disclosure may be buckled onto the circuit board 100. According to this embodiment of this disclosure, the metal shielding cover 300 is provided with two conductive pins 400, the front surface 101 of the circuit board 100 is correspondingly provided with two assembling terminals 200, the circuit board 100 is also provided with two through holes 103 at positions respectively corresponding to the conductive pin 400 and the assembling terminal 200. However, the number of the conductive pins 400, the corresponding assembling terminals 200 and the corresponding through holes 103 are not limited in this disclosure.

A plurality of conductive pins 400 and assembling terminals 200 are arranged for positioning, and specific articulation is recited in following description. One force direction the assembling terminals 200 exerted on the corresponding conductive pin 400 is non-parallel with another force direction of the other assembling terminal 200 exerted on the other corresponding conductive pin 400. Therefore, the metal shielding cover 300 may be prevented from shifting along a lateral direction of each conductive pin 400. Specifically, according to the voltage conversion device of this disclosure, each of the conductive pins 400 is in a flat shape, and normal directions of the conductive pins 400 are non-parallel with each other. Each clamp 220 clamps on side edge of each corresponding conductive pin 400, and one force direction of the assembling terminal 200 exerted on the corresponding conductive pin is therefore non-parallel with another force direction of the other assembling terminal 200 exerted on the other corresponding conductive pin 400.

According to this embodiment, each claw 221 presses on the side edge of the conductive pin 400 when the clamp 220 clamps the conductive pin 400. Since the conductive pins 400 are in the flat shape, each claw 221 may be further deformed to increase intensity of clamping force.

Figure 7:
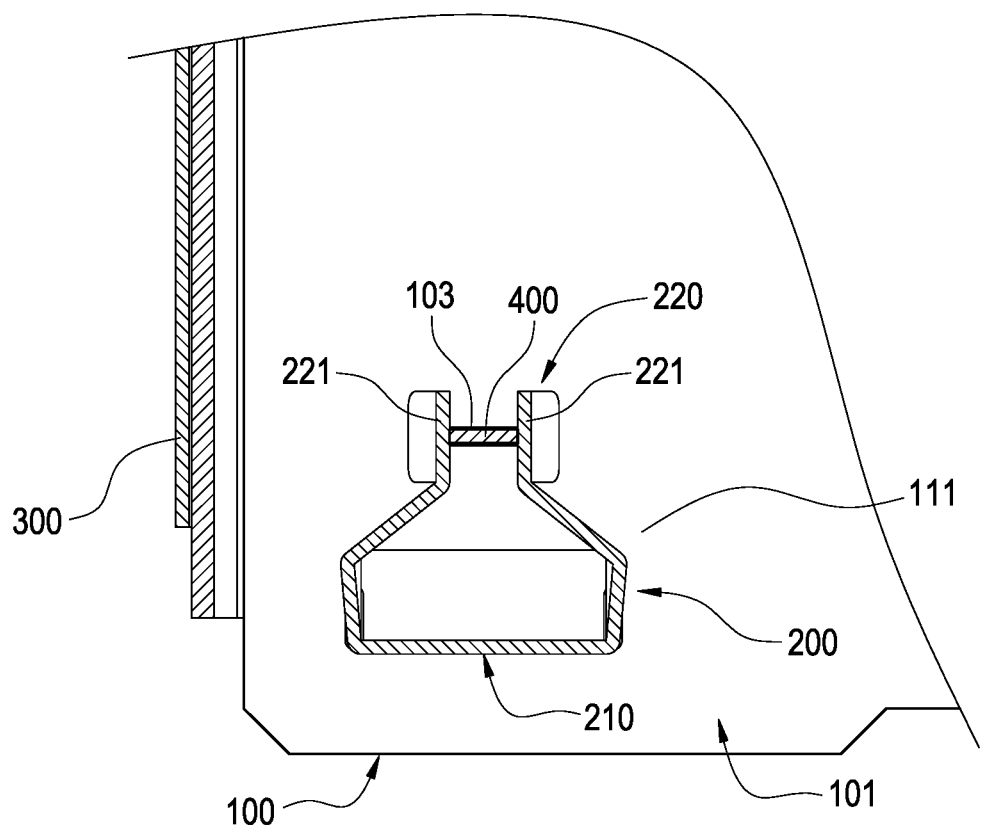
FIGS. 7 and 8 are perspective views showing a voltage conversion device according to another embodiment of this disclosure.
Figure 8:
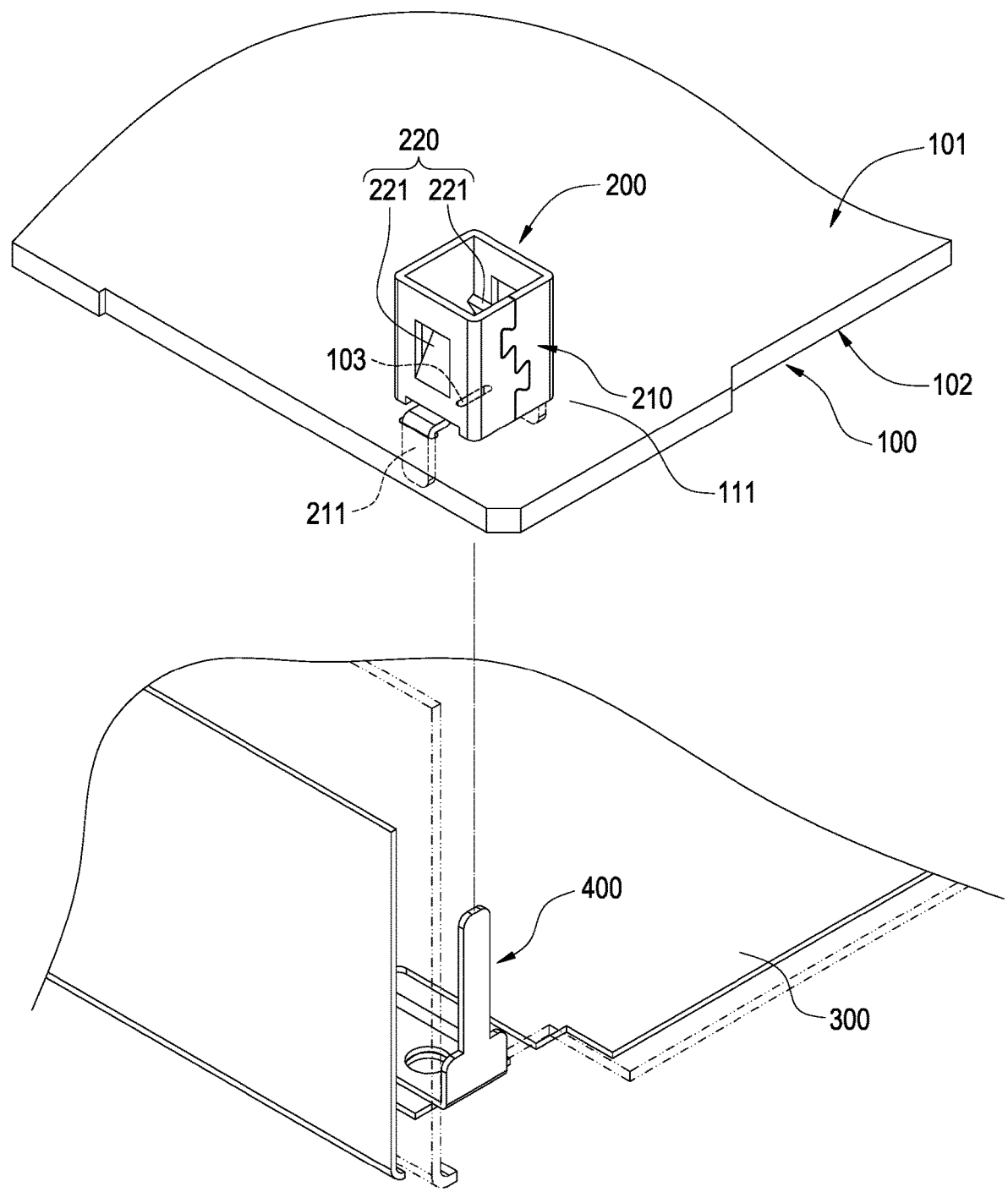

According to another embodiment of this disclosure shown in FIGS. 7 and 8, another type of the assembling terminal 200 is provided in this embodiment. The assembling terminal 200 has a base 210 and a clamp 220, the base 210 is a cylinder. The cylinder is upright arranged on the circuit board 100 and surrounding the through hole 103. A leg 211 is extended from a bottom of the base 210 and the leg 211 is soldered to the circuit board 100. The clamp 220 has a pair of claws 221 extended from an internal surface of the base 210 and extended toward each other. The conductive pin 400 corresponding to the assembling terminal 200 is inserted in the base 210 and clamped between the claws 221. Furthermore, a guiding slope 222 facing to the through hole 103 and obliquely arranged relative to the circuit board 100 is formed on each of the claws 221. When the conductive pin 400 is inserted into the clamp 220, the conductive pin 400 may be guided by the guiding slopes 222 and therefore easy to be inserted into the clamp 220. According to this embodiment, the claw 221 of the clamp 220 is arranged in the cylindrical base 210, and thereby the clamp 220 is prevented from inclination when the conductive pin 400 is inserted into the clamp 220.

Figure 9:
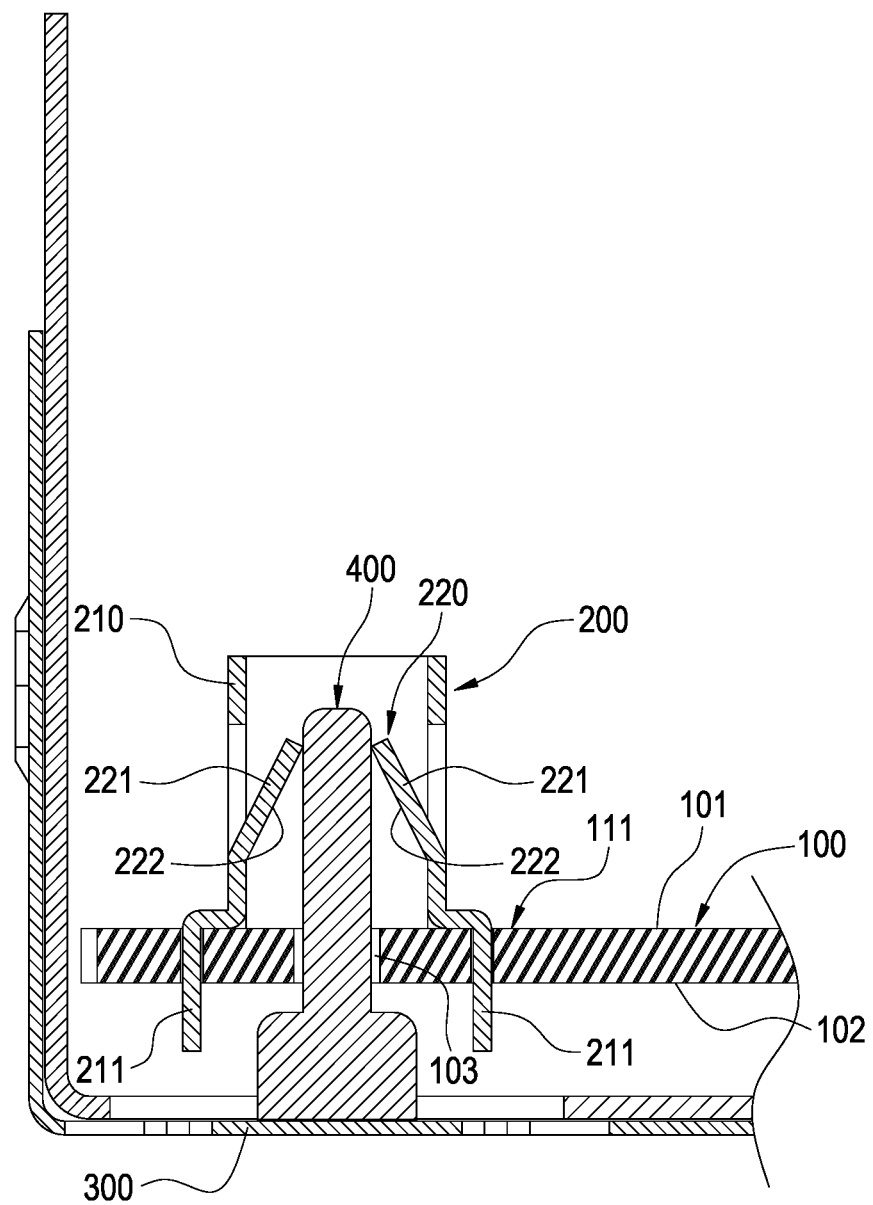
FIGS. 9 to 11 are perspective views showing a voltage conversion device according to further another embodiment of this disclosure.
Figure 10:
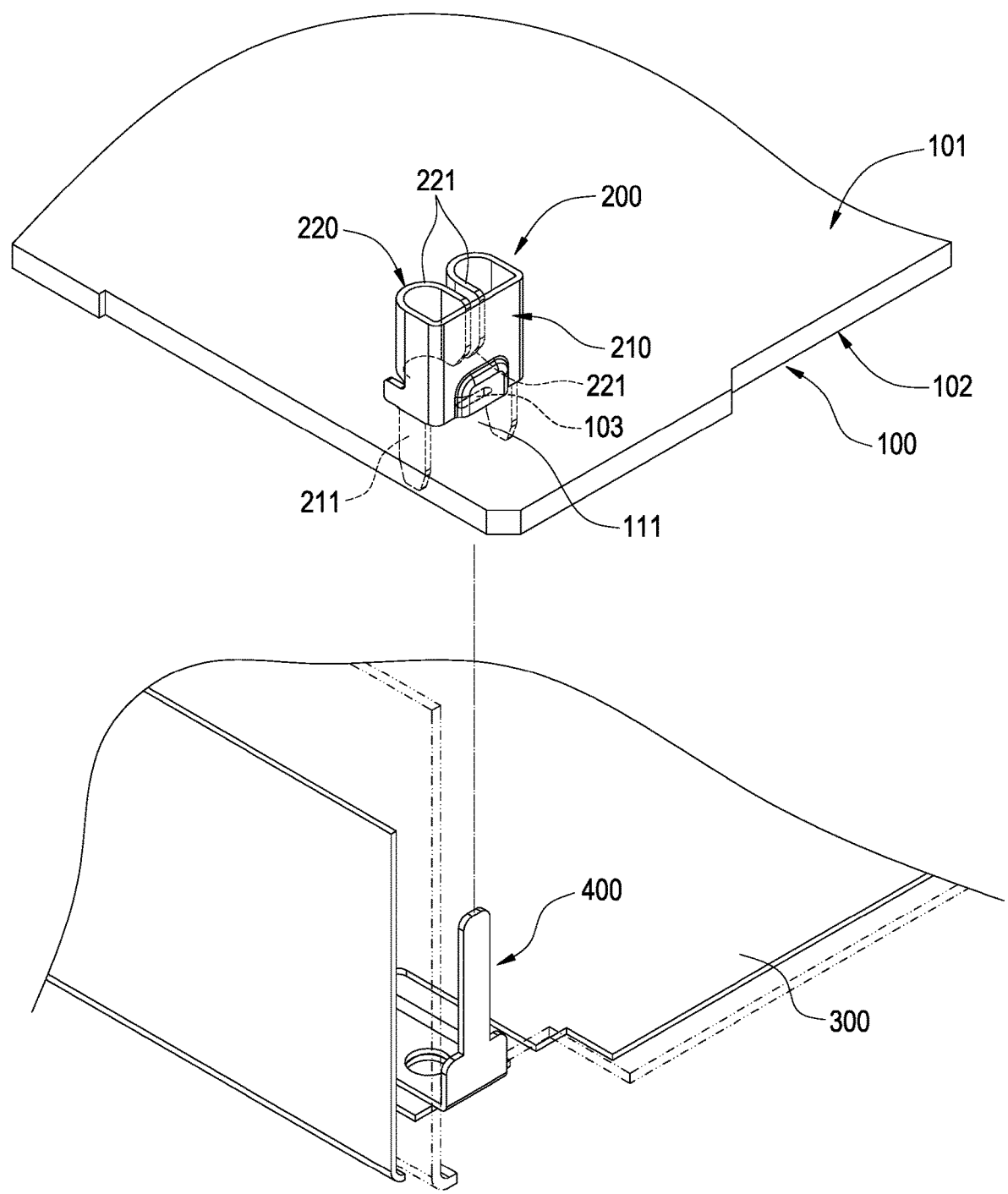
Figure 11:
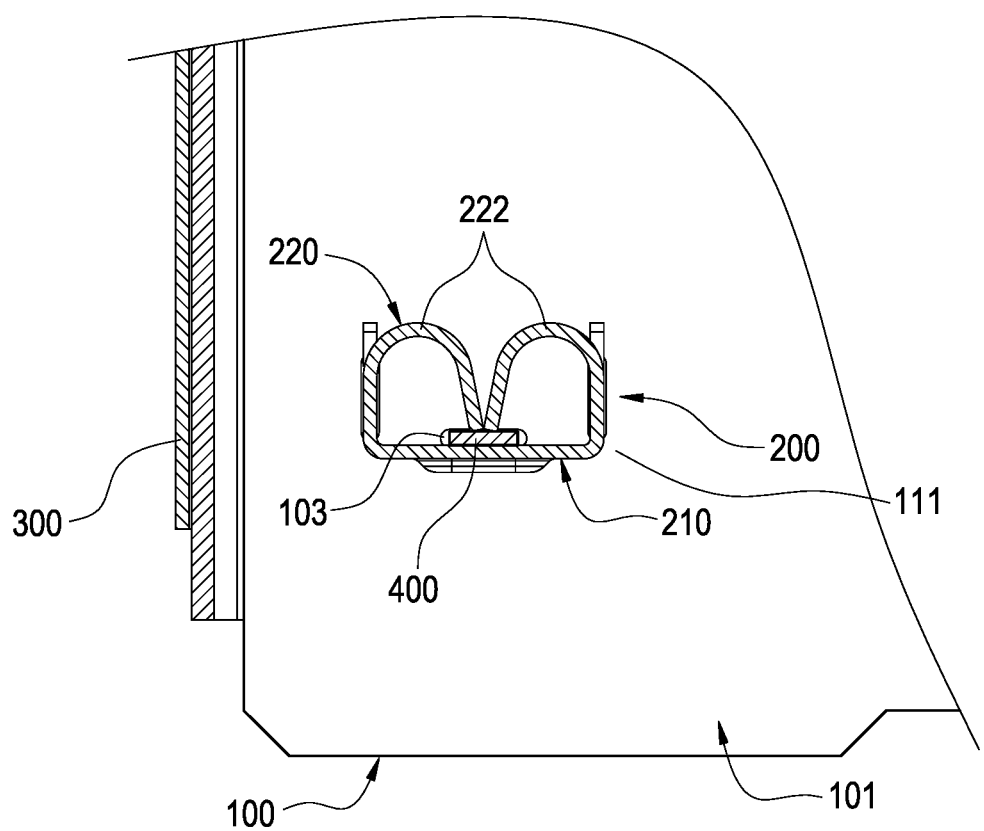

According to further another embodiment of this disclosure shown in FIGS. 9 to 11, further another type of the assembling terminal 200 is provided in this embodiment. The assembling terminal 200 has a base 210 upright arranged on the circuit board and a clamp 220. A leg 211 is extended from a bottom of the base 210 and the leg 211 is soldered to the circuit board 100. The clamp 220 has a claw 221 extended from a side of the base 210, an end of the claw 221 is reversely bent toward the base 210, and the conductive pin corresponding to the assembling terminal 200 is clamped between the claw 221 and the base 210. Regarding to some arrangements, this embodiment is implemented with single claw 221, and the number of the claw 221 is not limited in this embodiment. A pair of claws 221 with shapes mirrored to each other are provided in this embodiment, the claws 221 have the same function, intensity of the clamping force to the conductive pin 400 may be increased by this arrangement and the claws 221 may exert uniform forces on the conductive pin 400. Furthermore, a guiding slope 222 facing to the through hole 103 and obliquely arranged relative to the circuit board 100 is formed on each claw 221. When the conductive pin 400 is inserted into the clamp 220, the conductive pin 400 may be guided by the guiding slopes 222 and therefore easy to be inserted into the clamp 220.

According to this embodiment, the conductive pin 400 is clamped between the claws 221 and the base 210. The base 210 is fixed, and thereby the conductive pin 400 may be positioned and prevented from shifting.

According to the voltage conversion device of this disclosure, the metal shielding cover 300 may be assembled in a buckling manner and it is therefore suitable for automatic assembling process. Moreover, other electronic elements are also suitable for automatic assembling process, and this disclosure is therefore suitable for fully automatic assembling process, and thereby manufacturing cost may be decreased.

While this disclosure has been described by means of specific embodiments, numerous modifications and variations may be made thereto by those skilled in the art without departing from the scope and spirit of this disclosure set forth in the claims.

What is claimed is:

1. A voltage conversion device, comprising:
    a circuit board, comprising a front surface and a back surface, a transformer circuit and an assembling terminal disposed on the front surface of the circuit board, the assembling terminal electrically connected to the transformer circuit, and a through hole disposed on the circuit board at a position corresponding to the assembling terminal; and
    a metal shielding cover, covering the back surface of the circuit board, and comprising a conductive pin disposed corresponding to the assembling terminal,
    wherein the assembling terminal comprises a clamp arranged corresponding to the position of the through hole, the conductive pin passes through the through hole and is clamped by the clamp to fix the metal shielding cover on the circuit board.

2. The voltage conversion device according to claim 1, further comprising an insulative housing, the circuit board and the metal shielding cover being accommodated in the insulative housing, and a profile of the metal shielding cover being matched with at least a portion of an internal surface of the insulative housing.

3. The voltage conversion device according to claim 1, wherein the assembling terminal comprises a base upright arranged on the circuit board, a leg is extended from a bottom of the base and soldered to the circuit board, a pair of claws are extended from a side of the base, and the conductive pin corresponding to the assembling terminal is clamped by the pair of claws.

4. The voltage conversion device according to claim 1, wherein the assembling terminal comprises a base, the base is a cylinder upright arranged on the circuit board and surrounding the through hole, a leg is extended from a bottom of the base and soldered to the circuit board, a pair of claws faced to each other are extended from an internal surface of the base, and the conductive pin corresponding to the assembling terminal is inserted in the base and clamped by the pair of claws.

5. The voltage conversion device according to claim 1, wherein the assembling terminal comprises a base upright arranged on the circuit board, a leg is extended from a bottom of the base and soldered to the circuit board, a claw is extended from a side of the base, an end of the claw is reversed toward the base, and the conductive pin corresponding to the assembling terminal is clamped between the claw and the base.

6. The voltage conversion device according to claim 1, wherein the assembling terminal comprises a base upright arranged on the circuit board, a leg is extended from a bottom of the base and soldered to the circuit board, a claw is extended from a side of the base, and a guiding slope is disposed on the claw, the guiding slope faces the through hole and is obliquely arranged corresponding to the circuit board.

7. The voltage conversion device according to claim 1, wherein the metal shielding cover comprises an aluminum or a stainless steel.

8. The voltage conversion device according to claim 7, wherein the conductive pin is riveted on the metal shielding cover.

9. The voltage conversion device according to claim 1, wherein the transformer circuit comprises a ground area, and the assembling terminal is electrically connected to the ground area.

10. The voltage conversion device according to claim 1, wherein another conductive pin is disposed on the metal shielding cover, each of the conductive pins are in a flat shape, and normal directions of each of the conductive pins are non-parallel with each other.

11. The voltage conversion device according to claim 1, wherein another conductive pin is disposed on the metal shielding cover and another assembling terminal is disposed on the front surface of the circuit board correspondingly, a force direction of the assembling terminal exerted on the conductive pin is non-parallel with a force direction of the another assembling terminal exerted on the another conductive pin.

* * * * *